(12) United States Patent
Lam et al.

(10) Patent No.: US 6,972,486 B2
(45) Date of Patent: Dec. 6, 2005

(54) LOW PROFILE CARRIER FOR NON-WAFER FORM DEVICE TESTING

(75) Inventors: Ken M. Lam, Colorado Springs, CO (US); Julius A. Kovats, Manitou Springs, CO (US)

(73) Assignee: Atmel Corporation, San Jose, CA (US)

( * ) Notice: Subject to any disclaimer, the term of this patent is extended or adjusted under 35 U.S.C. 154(b) by 103 days.

(21) Appl. No.: 10/661,316

(22) Filed: Sep. 12, 2003

(65) Prior Publication Data

US 2005/0060115 A1    Mar. 17, 2005

(51) Int. Cl.[7] .......................... H01L 23/06; H01L 23/10
(52) U.S. Cl. ..................................... 257/710; 257/729
(58) Field of Search .......................... 257/48, 678, 704, 257/710, 727, 729; 438/14, 15; 324/754, 324/755; 361/801

(56) References Cited

U.S. PATENT DOCUMENTS

| | | | | |
|---|---|---|---|---|
| 4,661,886 A | * | 4/1987 | Nelson et al. | 361/757 |
| 5,247,248 A | * | 9/1993 | Fukunaga | 324/760 |
| 5,669,599 A | * | 9/1997 | Toh et al. | 269/8 |
| 5,742,169 A | * | 4/1998 | Akram et al. | 324/755 |
| 5,986,459 A | * | 11/1999 | Fukaya et al. | 324/755 |
| 6,142,361 A | * | 11/2000 | Downes et al. | 228/173.1 |
| 6,467,627 B1 | * | 10/2002 | Troxtell, Jr. | 206/714 |

OTHER PUBLICATIONS

Website printout: SingleChip, "Special Holders for Single Chip Etching", 1 page.

* cited by examiner

Primary Examiner—Craig A. Thompson
Assistant Examiner—Jennifer M. Dolan
(74) Attorney, Agent, or Firm—Schneck & Schneck; Thomas Schneck

(57) ABSTRACT

The present invention allows non-wafer form devices to be tested on a standard automatic wafer-probe tester or other automated test or measurement device commonly employed in semiconductor or allied industries (e.g., flat panel display, data storage, or the like) processes. The present invention accomplishes this by providing a low-profile carrier for temporarily mounting a non-wafer form device. The low-profile carrier holds the non-wafer form device (e.g., an integrated circuit chip, a thin film head structure, one or more molded array packages, etc.) magnetically into recesses which are machined or otherwise formed in the low-profile carrier.

14 Claims, 4 Drawing Sheets

LOW PROFILE CARRIER FOR NON-WAFER FORM DEVICE TESTING

TECHNICAL FIELD

The present invention relates to a test carrier for a semiconductor integrated circuit. More particularly, the present invention relates to a test carrier for holding a semiconductor integrated circuit, or the like, in non-wafer form for testing on an automated wafer probe tester or other piece of test or metrology equipment.

BACKGROUND ART

Integrated circuit (IC) manufacturers produce die on typically circular substrates referred to as wafers. A wafer may contain hundreds of individual rectangular or square die. Die on wafer, or unsingulated die, must be tested to determine good from bad before the dies are singulated. Unsingulated die testing traditionally occurs by physically probing each die at the die pads, which allows a tester connected to the probe to determine good or bad die.

Conventional die testing is performed using a tester and pad probe assembly. The probe assembly is positioned over a selected die and lowered to make contact with the die pads. Once contact is made the tester applies power and checks for die functionality. If the test fails the die is marked as bad.

In general, when the semiconductor integrated circuit formed on the semiconductor wafer is tested, a production probe test is frequently utilized wherein test probes electrically connected to the testing apparatus are contacted to electrodes formed on the surface of the semiconductor wafer.

However, when bare chips are separated by dicing of the wafer, variations are caused in an outer size of the chip and their locations with respect to outer shapes of electrodes formed on the bare chip. As a result, the electrodes on the bare chip and the contact terminals on the testing substrate cannot be aligned with good precision. In addition, since a clearance to connect the testing substrate and the bare chip resides, displacement in location is easy to be caused in the clearance.

Additionally, standard wafer-probe testers are limited to testing wafers due to several factors. These factors include a wafer transport mechanism (typically a robotic transport mechanism), machine clearances, wafer boat slot-widths, and so on. These factors are designed to handle standardized wafer dimensions which are set by international consensus standards. Typical wafer sizes include 100 mm, 125 mm, 150 mm, 200 mm, and 300 mm wafer diameters which range in nominal thickness from 525 $\mu$m to 775 $\mu$m. Although the wafer diameter is critical for a given tool, often, the tool can accommodate a wafer thickness of up to 1270 $\mu$m (approximately 50 mils).

A typical solution will be to fabricate or modify devices to be tested into a standard wafer shape, diameter, and thickness. However, this solution presents several problems. Some devices are not suitable for modification due to size constraints (e.g., an overall thickness will be too great when mounted or otherwise affixed to a suitable carrier substrate). Other devices will sacrifice yield by discarding good devices while attempting to accommodate to a standard wafer size (e.g., a large molded array package (MAP) will lose peripheral devices when the MAP is modified into a wafer form). Still other devices are not compatible with standard vacuum transport tools (such as vacuum end-effectors on robotic transport arms).

Therefore, what is needed is a means to allow non-wafer form devices to be tested on standard automated fabrication-facility testing and measurement equipment ("tools"). Ideally, such means would be readily reusable for similar non-wafer form devices.

DISCLOSURE OF THE INVENTION

The present invention allows non-wafer form devices to be tested on a standard automatic wafer-probe tester or other automated test or measurement device commonly employed in semiconductor or allied industries (e.g., flat panel display, data storage, or the like) processes.

The present invention accomplishes this by providing a low-profile carrier for temporarily mounting a non-wafer form device. The low-profile carrier holds the non-wafer form device (e.g., an integrated circuit chip, a thin film head structure, one or more molded array packages, etc.) magnetically into recesses which are machined or otherwise formed in the low-profile carrier.

In one embodiment, the low-profile carrier comprises a test ring holder configured to hold the non-wafer form device. The test ring holder is configured to be bonded to a mechanical support base, for example, a thinned semiconductor wafer. A test ring magnet with a thru-hole is configured to be mounted substantially within a first recess formed on the top of the test ring holder and a concentric second recess machined within the first recess forms a mounting location for the non-wafer form device. Finally, a test ring cover is configured to hold the non-wafer form device magnetically within the test ring holder.

In an alternative embodiment, a low-profile carrier comprises a test ring holder configured to hold said non-wafer form device. The test ring holder is additionally configured to be mechanically coupled to a support base. A test ring cover with a thru-hole is configured to be held magnetically in a location proximate to the test ring holder and is mounted substantially within a first recess formed within the top of the test ring holder. A second recess is concentrically machined in the first recess and forms a mounting location for the non-wafer form device.

In another alternative embodiment, a low-profile carrier comprises a test ring holder configured to hold the non-wafer form device. The test ring holder is additionally configured to be mechanically coupled to a support base. A test ring cover with a thru-hole is configured to be held magnetically in a location proximate to the test ring holder and to be mounted substantially within a first recess formed within the top of the test ring holder. A second recess is concentrically machined in the first recess and forms a mounting location for the non-wafer form device. A thru-hole is formed within the test ring holder and circumscribed within the second recess. Finally, an insert configured to be mounted within the thru-hole is coupled to the support base and serves to be magnetically attracted to the test ring cover, thereby holding the non-wafer form device in place.

MODES FOR CARRYING OUT INVENTION

Figure 1:
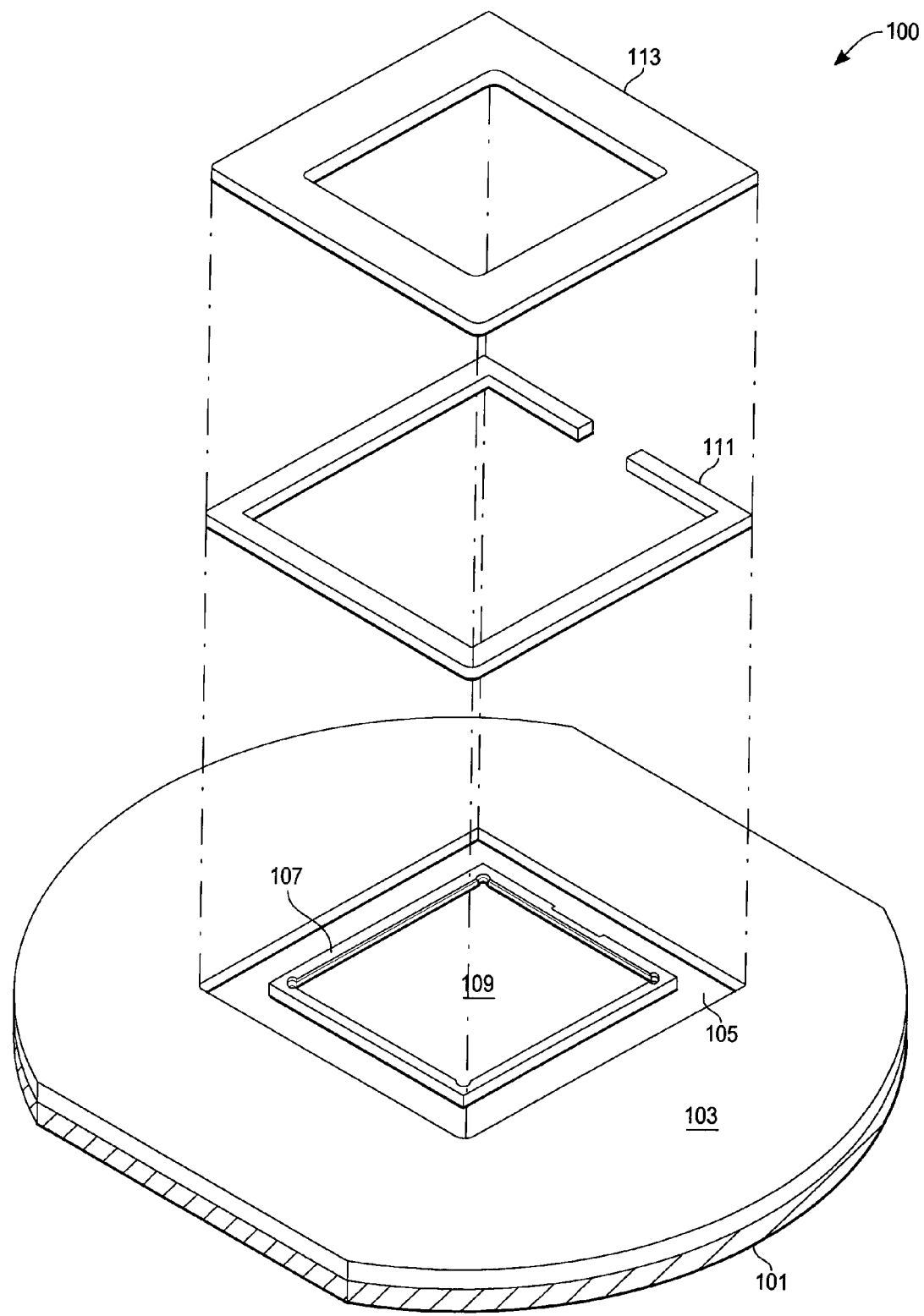
FIG. 1 shows a three-dimensional assembly drawing of an exemplary embodiment of a low-profile carrier.

The present invention will now be described with reference to preferred embodiments thereof. FIG. 1 shows an exemplary embodiment of a low-profile carrier 100. The low-profile carrier generally includes a semiconductor wafer support 101, a test ring holder 103 with a first recess 105, a second recess 107, and an optional thru-hole 109, a test ring magnet 111, and a test ring cover 113. A non-wafer form device (e.g., an integrated circuit chip, a thin film head structure, one or more molded array packages, etc.—not shown) is placed between the test ring magnet 111 and is held in place by the test ring cover 113. The low-profile carrier with the mounted non-wafer form device may then be placed into, for example, a wafer boat to allow the non-wafer form device to be loaded by an automated test machine, such as a wafer-prober.

The semiconductor wafer support 101 serves as a mechanical support base for the test ring holder 103. Using a semiconductor wafer as a support base allows easy compatibility with various transport mechanism end-effectors with reduced concern for contamination from non-semiconductor materials (e.g., heavy metal contamination from certain types of metallic impurities).

In one embodiment, the wafer support 101 is a thinned silicon wafer with dimensional characteristics that are, other than thickness, in accordance with Semiconductor Equipment and Materials International (SEMI) Material Standards (SEMI's Global Headquarters is located at 3081 Zanker Road, San Jose, Calif. 95134, www.semi.org). The wafer is thinned by processes well know in the art to approximately 280 $\mu$m thick. The thinned wafer prevents a total thickness of the low-profile carrier 100 from exceeding 1270 $\mu$m as described herein.

Alternatively, a non-contaminating material such as polyimide could readily function as a substitute material for the semiconductor wafer support 101.

The test ring holder 103 is bonded to the wafer support 101. Bonding techniques are well known in the art and may include gold-silicon eutectic bonding. Alternatively, bonding may be accomplished with various types of adhesives. An overall thickness of the bonded wafer support 101 and the test ring holder 103 is typically chosen to be less than 1270 $\mu$m. The overall thickness is preferably less than 1270 $\mu$m to allow the low-profile carrier to readily fit into standard wafer boats or be handled properly by automated transport mechanisms.

The test ring holder 103 contains two milled or machined recesses 105, 107 (see also FIGS. 2 and 3) and an optional thru-hole 109. Inner and outer dimensions of the first recess 105 are selected to accept the test ring magnet 111. The first recess 105 is sufficiently deep so that a top surface of the test ring magnet, once inserted into the first recess 105, is at a level coplanar with or below a top surface of the second recess 107. A depth of the second recess 107 is selected so as to keep the non-wafer from device (not shown) at a level coplanar with or slightly above a top surface of the test ring holder 103 once the non-wafer form device is mounted into the low-profile carrier 100. A distance that a non-wafer from device may extend above the top surface of the test ring holder 103 will vary depending upon the height tolerances of a testing or measurement tool. As an example, a mounted non-wafer form device will extend 100 $\mu$m to 400 $\mu$m above the top surface of the test ring holder 103. The optional thru-hole 109 prevents mounting interference caused by irregularities on a bottom side of the non-wafer form device. Finally, an outer dimension of the test ring cover 113 is selected to fit within the first recess 105 and an inner dimension is selected to slightly overlap the non-wafer from device on at least two sides. For example, a test ring cover with inner dimensions of 8 mm by 10 mm will adequately secure a 10 mm by 10 mm non-wafer form device. The test ring cover 113 may be any ferrous material that is capable of being magnetically attracted to the test ring magnet 111. For example, the test ring cover may be machined from tempered blue spring steel.

Figure 2:
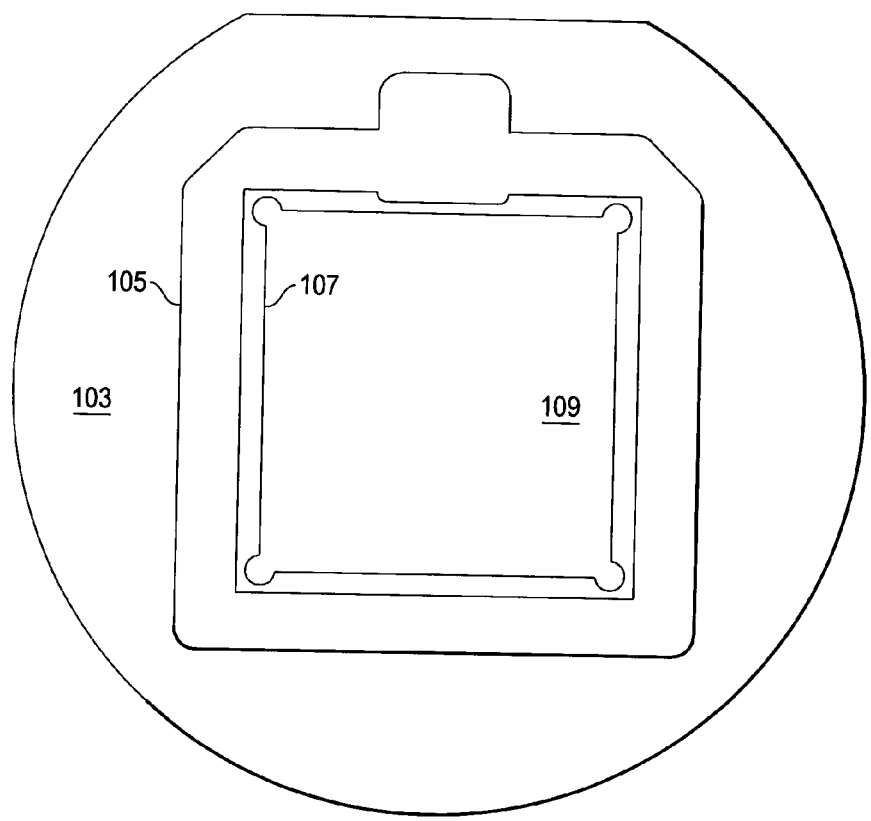
FIG. 2 shows an exemplary embodiment of a test ring holder emulating a form factor of a semiconductor wafer.

FIG. 2 shows a plan view of an exemplary embodiment of the test ring holder 103 emulating a form factor of a semiconductor wafer. In this case, the test ring holder 103 is emulating a wafer size in the range of 100 mm to 150 mm (due to the wafer "flat" shown). Optionally, the test ring holder 103 may also be notched to emulate an appearance of a 200 mm or 300 mm wafer or have additional secondary flats for various wafer orientations. In accordance with a desirable maximum thickness of 1270 $\mu$m as described supra, the test ring holder in this embodiment is chosen to be less than about 990 $\mu$m. Virtually any non-contaminating material may be chosen. For example, the test ring holder 103 may be machined from FR-4 substrate material (FR-4 is an alkali-free glass cloth impregnated with resin and is frequently used for printed circuit board substrates, see for example http://www.cooksonpwb.com/laminates).

Figure 3:
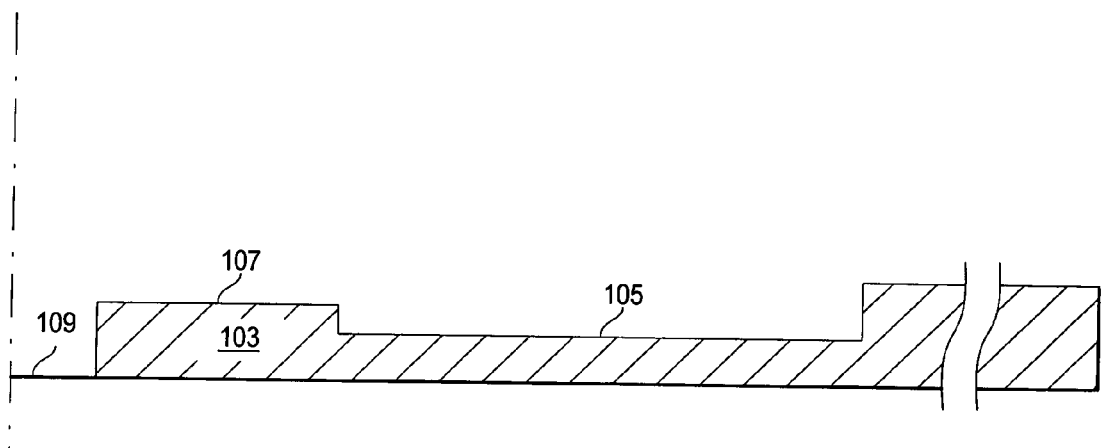
FIG. 3 shows a centerline cross-section of the test ring holder of FIG. 2.

FIG. 3 shows a centerline cross-section of the test ring holder 103. FIG. 3 is expanded in a vertical dimension to more clearly show the relative depths of the first and second recesses 105, 107. The first recess 105 accepts the test ring magnet 111 and the second recess 107 (see FIG. 1) serves as a pedestal for a non-wafer form device.

Figure 4:
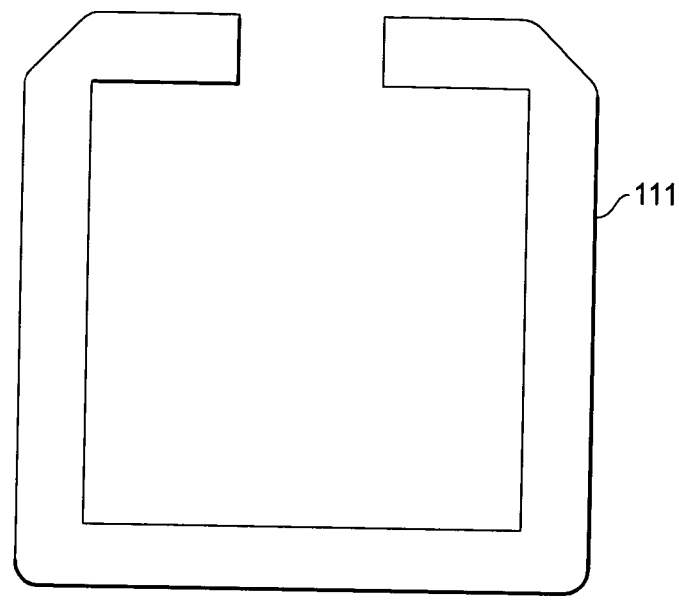
FIG. 4 shows an exemplary embodiment of a test ring magnet used to aid in securing a non-wafer form device to the test ring holder of FIG. 2.

FIG. 4 shows an exemplary embodiment of a test ring magnet 111 used as an aid in securing a non-wafer form device to the test ring holder 103. The test ring magnet 111 may be formed from any commercially available magnetic sheet material. For example, the test ring magnet 111 may be machined from a 400 $\mu$m (approximately 1/64") thick adhesive-backed magnetic sheet with outer and inner dimensions chosen as described supra. The adhesive backing adheres the test ring magnet 111 to the first recess 105 of the test ring holder 103.

Figure 5:
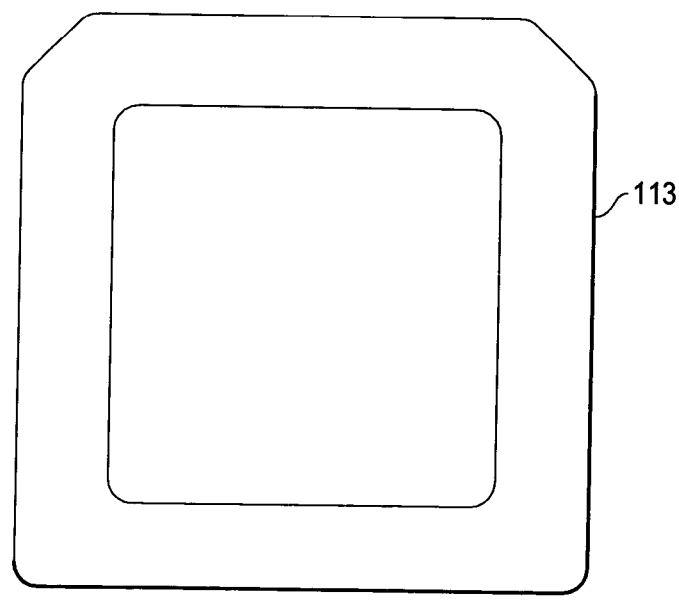
FIG. 5 shows a test ring cover used for securing the non-wafer form device to the test ring holder of FIG. 2.

FIG. 5 shows the test ring cover 113 used for securing the non-wafer form device to the test ring holder 103. The test ring magnet 111 may be formed from any commercially available ferrous, non-contaminating material. For example, the test ring magnet 111 may be machined from a 250 $\mu$m (approximately 10 mil) thick blue tempered spring steel sheet with outer and inner dimensions chosen as described supra.

Figure 6:
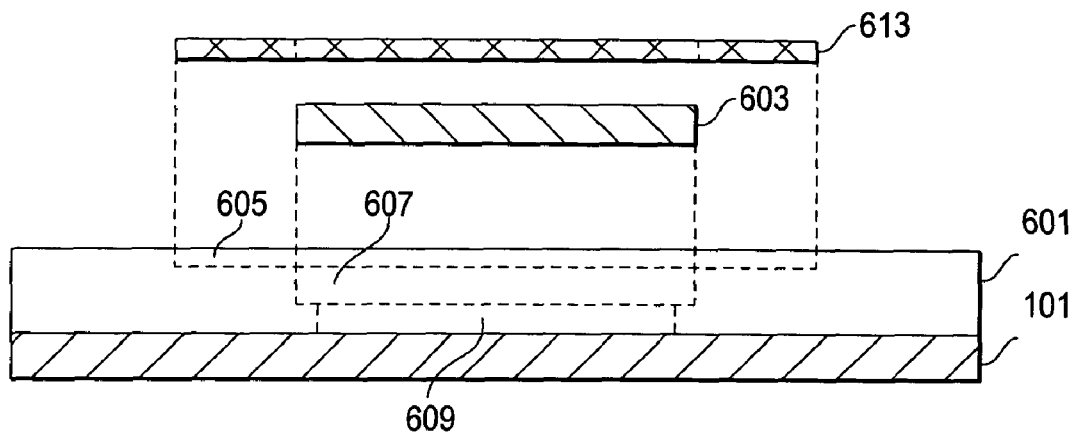
FIG. 6 shows an alternative exemplary embodiment of a low-profile carrier.

FIG. 6 shows an alternative exemplary embodiment of a low-profile carrier. The low-profile carrier of FIG. 6 includes a semiconductor wafer support 101, a test ring holder 601 with a first recess 605 and a second recess 607, an optional thru-hole 609, and a test ring cover 613. Also shown is a non-wafer form device 603.

In this embodiment, the test ring holder 601 is bonded to the semiconductor wafer support and is similar to a shape and dimensions of the test ring holder 103 as described elsewhere (see FIGS. 1 and 2). In this embodiment, the test ring holder 601 is machined from a permanently magnetic material (e.g., a magnetic sheet material). The alternative exemplary embodiment of FIG. 6 has stepped recesses 605, 607 as shown. The non-wafer form device is inserted into the test ring holder 601 and rests upon the second recess 607. The test ring cover 613 is dimensioned as described herein with respect to the non-wafer form device 603 and secures the non-wafer form device 603 to the low profile carrier.

In an alternative embodiment of FIG. 6, the test ring holder 601 is machined from a ferrous, non-contaminating material and the test ring cover 613 is machined from a magnetic material (e.g., a magnetic sheet material). In yet another embodiment, both the test ring holder 601 and the test ring cover 613 are machined from a magnetic material.

Figure 7:
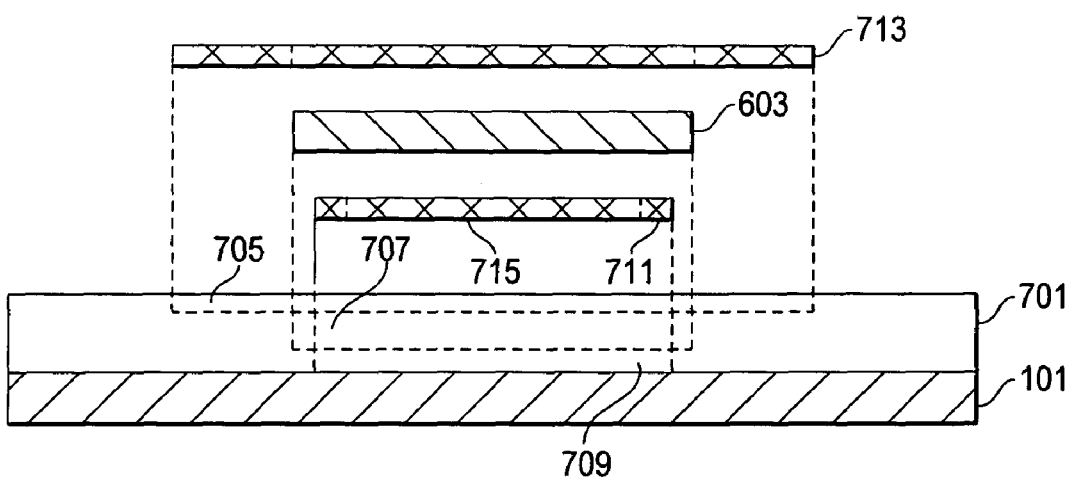
FIG. 7 shows another alternative exemplary embodiment of a low-profile carrier.

FIG. 7 shows another alternative exemplary embodiment of a low-profile carrier. The low-profile carrier of FIG. 7 includes a semiconductor wafer support 101, a test ring holder 701 with a first recess 705, a second recess 707, and a test ring holder thru-hole 709, an insert 711 with an optional insert thru-hole 715, and a test ring cover 713. Also shown is the non-wafer form device 603.

In this embodiment, the test ring holder 701 is bonded to the semiconductor wafer support and is similar to a shape and dimensions of the test ring holder 103 as described herein (see FIGS. 1 and 2). In this embodiment, the test ring holder 701 is machined from any suitable, non-contaminating material (e.g., a polyimide). The alternative exemplary embodiment of FIG. 7 has stepped recesses 705, 707 and a test ring holder thru-hole 709 as shown. The insert 711 is placed within the test ring holder thru-hole 709. Optionally, the insert is mechanically bonded to either the test ring holder thru-hole 709 at an edge or to the semiconductor wafer support 101. The non-wafer form device 603 is placed onto the insert 711. The test ring cover 713 is dimensioned as described herein with respect to the non-wafer form device 603 and secures the non-wafer form device 603 to the low profile carrier. In this alternative embodiment, either one of the elements, the insert 711 or the test ring cover 713, is machined from a magnetic material and the other material is machined from a ferrous, non-contaminating material. Alternatively, both the inset 711 and the test ring cover 713 can be machined from magnetic materials.

Although the detailed description and drawings describe a test ring holder mounted to a semiconductor wafer, one skilled in the art will recognize that other embodiments can readily be contemplated without departing from the intended scope of the device described. For example, the mounting substrate is described in terms of a semiconductor wafer. A skilled artisan will recognize that another type of substrate, such as a quartz photomask blank, may be used for tools designed to automatically check photomasks and reticles. In this case, dimensions may need to be scaled appropriately for recess depths, etc. Further, other types of substrates with mechanical characteristics similar to the semiconductor wafer may be substituted for the semiconductor wafer. Additionally, devices and procedures described herein are readily adaptable to tools other than electrical test probes, such as automated metrology equipment. Therefore, the scope of the present invention shall only be limited by the appended claims.

What is claimed is:

1. A low-profile carrier for temporarily mounting a non-wafer form device comprising:
   a test ring holder configured to hold said non-wafer form device, said test ring holder having a first face and a second face, said second face of said test ring holder configured to be bonded to a mechanical support base;
   a test ring magnet configured to be mounted substantially within a first recess formed within said first face of said test ring holder;
   a second recess formed within said first face of said test ring holder and circumscribed within said first recess, said second recess forming a mounting location for said non-wafer form device; and
   a test ring cover configured to be mounted in said first recess and held magnetically in a location proximate to said test ring holder, a combined thickness of the test ring holder and the mechanical support base not exceeding 1270 microns.

2. The low-profile carrier of claim 1 wherein said test ring magnet is mounted to said test ring holder by an adhesive.

3. The low-profile carrier of claim 1 wherein said mechanical support base is about 280 microns in thickness.

4. The low-profile carrier of claim 1 wherein said test ring holder is fabricated from an alkali-free glass cloth impregnated with resin.

5. The low-profile carrier of claim 1 wherein said test ring holder is fabricated from polyimide.

6. The low-profile carrier of claim 1 wherein said first and second recesses have a depth sufficient to mount both said test ring magnet and said test ring cover in such a way as to be substantially coplanar with or below a non-recessed portion of said first face.

7. A low-profile carrier for temporarily mounting a non-wafer form device comprising:
   a test ring holder configured to hold said non-wafer form device, said test ring having a first face and a second face, said second face configured to be mechanically coupled to a support base;
   a test ring cover configured to be held magnetically in a location proximate to said test ring holder and to be mounted substantially within a first recess formed with said first face of said test ring holder; and
   a second recess formed within said first face of said test ring holder and circumscribed within said first recess, said second recess forming a mounting location for said non-wafer form device, at least one of the test ring cover or the test ring holder being formed from a permanently magnetic material.

8. The low-profile carrier of claim 7 wherein said test ring holder is formed with a thru-hole circumscribed within said second recess.

9. A low-profile carrier for temporarily mounting a non-wafer form device comprising:
   a test ring holder configured to hold said non-wafer form device, said test ring having a first face and a second face, said second face of said test ring holder configured to be mechanically coupled to a support base;
   a test ring cover configured to be held magnetically in a location proximate to said test ring holder and to be mounted substantially within a first recess formed within said first face of said test ring holder;
   a second recess formed within said first face of said test ring holder and circumscribed within said first recess, said second recess forming a mounting location for said non-wafer form device;
   a thru-hole formed within said test ring holder and circumscribed within said second recess; and
   an insert configured to be mounted within said thru-hole and in communication with said support base.

10. The low-profile carrier of claim 9 wherein said test ring cover is formed from a permanently magnetic material.

11. The low-profile carrier of claim 9 wherein said insert is formed from a permanently magnetic material.

12. The low-profile carrier of claim 9 wherein both said test ring cover and said insert are formed from a permanently magnetic material.

13. The low-profile carrier of claim 9 wherein said insert is formed with a thru-hole.

14. A low-profile carrier adapter for temporarily mounting a non-wafer form device comprising:
- a means for holding said non-wafer form device, said holding means having a first face and a second face, said second face of said holding means configured to be mechanically coupled to a support base;
- a means for covering said non-wafer form device, said covering means configured to be held magnetically in a location proximate to said holding means and to be mounted within a first recess formed within said first face of said holding means; and
- a second recess formed within said first face of said holding means and circumscribed within said first recess, said second recess forming a mounting location for said non-wafer form device, at least one of the holding means or the covering means being formed from a permanently magnetic material.

* * * * *